United States Patent
Guo et al.

(10) Patent No.: US 12,254,935 B2
(45) Date of Patent: Mar. 18, 2025

(54) USE OF CONFIGURABLE PHASE RANGE TO DETECT DDR READ AND WRITE BURSTS

(71) Applicant: Rohde & Schwarz GmbH & Co. KG, Munich (DE)

(72) Inventors: Kevin Guo, Singapore (SG); Hong Jin Kim, Singapore (SG)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 18/298,467

(22) Filed: Apr. 11, 2023

(65) Prior Publication Data
US 2024/0347121 A1 Oct. 17, 2024

(51) Int. Cl.
*G11C 29/10* (2006.01)

(52) U.S. Cl.
CPC .................. *G11C 29/10* (2013.01)

(58) Field of Classification Search
CPC ......... G11C 29/10; G11C 29/56; G11C 29/40; G11C 29/44; G11C 29/38
USPC ................. 714/715, 718, 719, 720
See application file for complete search history.

(56) References Cited

U.S. PATENT DOCUMENTS

| | | | | |
|---|---|---|---|---|
| 6,285,962 | B1* | 9/2001 | Hunter | G11C 29/56 713/1 |
| 11,169,191 | B2* | 11/2021 | Botelho | G11C 29/028 |
| 2007/0234146 | A1* | 10/2007 | Watanabe | G01R 31/31919 714/724 |
| 2015/0030062 | A1* | 1/2015 | Kossel | H04L 27/01 375/232 |
| 2020/0309832 | A1* | 10/2020 | Botelho | G01R 25/005 |
| 2021/0389349 | A1* | 12/2021 | Pickerd | G01R 31/31905 |
| 2021/0390456 | A1* | 12/2021 | Pickerd | G01R 13/029 |
| 2023/0024413 | A1* | 1/2023 | Morita | H04L 5/0007 |

OTHER PUBLICATIONS

"QPHY-DDR4 DDR4 Serial Data Compliance Software Instruction Manual", Teledyne LeCroy, Revision E—Dec. 1, 2019, 71 pages.

* cited by examiner

*Primary Examiner* — Esaw T Abraham
*Assistant Examiner* — Osman M Alshack
(74) *Attorney, Agent, or Firm* — Westman, Champlin & Koehler, P.A.

(57) ABSTRACT

A method (and corresponding system, computer program and storage device) for testing a device under test, DUT, comprising: generating or receiving, by a component of the DUT, a bus signal, wherein the bus signal comprises a first data signal having a plurality of first phase angles or a second data signal having a plurality of second phase angles; averaging the phase angles for a predetermined bus signal length; comparing the averaged phase angle with a preset phase range; and identifying the first data signal or the second data signal in the bus signal based on the comparison.

10 Claims, 3 Drawing Sheets

FIG 4

DQS Triggering for Read/Write Separation

| | | |
|---:|:---:|:---|
| Triggering Method | ☑ Phase   ☑ Amplitude | 💬 Advanced |
| Min Phase for Read | -20 | Degree |
| Max Phase for Read | 20 | Degree |
| Min Phase for Write | 70 | Degree |
| Max Phase for Write | 110 | Degree |
| Amplitude Relationship | Read ▼ | |
| P-P Amplitude Threshold | 1.6 | V |

Threshold Mode  ⦿ Absolute   ◯ Relative

| | | |
|---:|:---:|:---|
| Upper Threshold | 0.5 | V |
| Middle Threshold | 0 | V |
| Lower Threshold | -0.5 | V |

Test Setup

| | | |
|---:|:---:|:---|
| Average Window | 200 | Periods |
| Record Length | 10 | us |
| Burst Count | 10 ▼ | |
| Speed Bin(CL-nRCD-nRP) | 2400P ▼ | |
| CAS Latency(CL) | 18 ▼ | |
| CAS Write Latency(CWL) | 12 ▼ | |
| Data Bus Inversion | ☐ | |

Tabs: Properties | Limit Manager | Results | Report Config

USE OF CONFIGURABLE PHASE RANGE TO DETECT DDR READ AND WRITE BURSTS

FIELD OF THE INVENTION

This patent application relates to the field of automated compliance testing or signal decoding for DDR signals, and specifically addresses the problem of separating read burst signal and write burst signal on problematic DUT (device under test).

BACKGROUND

DDR (Double Data Rate) is a type of synchronous dynamic random-access memory (SDRAM) that can transfer data at much faster speed rate of traditional SDRAM. DDR uses a technique called double pumping in order to transfer data on both the rising and falling edges of the clock signal, effectively doubling the rate at which data can be transferred.

DDR memory has been widely adopted in is now used in modern computer systems, particularly in high-end workstations, gaming PCs, and servers. DDR memory is also used in applications where high-speed data transfer is critical for instance in graphic cards for rendering complex graphics and animations.

DDR memory uses a complex signaling scheme that requires careful design and layout of the memory module and motherboard. The signal timing must be precisely controlled to ensure reliable operation at high clock speeds.

One common problem with DDR memory is signal integrity issues, which can occur when the signal quality degrades as it travels along its transmission path. This can lead to data errors and other issues. Signal integrity problems can be caused by a variety of factors, such as poor PCB layout, high electromagnetic interference, and/or poor termination.

In DDR memory, write and read operations occur in bursts. A burst is a group of data that is transferred between the memory controller and the memory module without interruption.

DDR write bursts occur when the memory controller writes data to the DDR memory. The write process begins with the memory controller sending a command to the memory module to initiate a write burst. The memory controller then sends the first block of data to the memory module. The memory module receives the data and writes it to the memory array. The memory module then sends an acknowledgment signal to the memory controller to indicate that the write operation has been completed. The memory controller then sends the next block of data to the memory module, and the process repeats until the entire write burst is complete.

DDR read bursts occur when the memory controller reads data from the DDR memory. The read process begins with the memory controller sending a command to the memory module to initiate a read burst. The memory controller then sends a request for the first block of data to the memory module. The memory module receives the request and retrieves the requested data from the memory array. The memory module then sends the requested data to the memory controller. The memory controller receives the data and sends a signal to the memory module to acknowledge that the data has been received. The memory controller then sends a request for the next block of data, and the process repeats until the entire read burst is complete.

It is important to note that DDR write and read bursts must be properly separated to ensure that data transfers occur correctly. If the write and read bursts are not properly separated, data transfers can be corrupted or lost, leading to system errors and crashes.

In order to separate DDR write and read bursts, the phase difference between the data signal and the strobe signal has been used in the past. The strobe signal is a timing signal that is sent along with the data signal to ensure that the data is sampled at the correct time. The phase difference between the data signal and the strobe signal must be carefully managed to ensure that the read and write bursts are properly separated.

For a DDR write burst, the data signal and the strobe signal are typically a quarter cycle out of phase. This means that the phase difference between the two signals is 90 degrees. For a DDR read burst, the data signal and the strobe signal are in phase, meaning that the phase difference between the two signals is 0 degrees.

DDR memory controllers and memory modules are designed to automatically manage the phase difference between the data and strobe signals to ensure that write and read bursts are properly separated.

The conventional solution for separating read and write bursts follows the JEDEC standard specifications, which use preamble pulse shape or phase difference between data and data strobe to separate them. Specifically, in DDR3, preamble pulse shape is used to separate read and write bursts, while in DDR4, phase difference between data and data strobe is used. The phase difference definition in DDR signal is, for write burst, the phase difference is 90 degree (a quarter clock cycle out of phase), while for read signal, the phase difference is 0 degree (in phase).

However, this conventional phase difference solution is not stable and can easily produce incorrect results, as the actual phase difference between data and data strobe signal can vary from DUT to DUT, and from edge to edge, due to various factors such as DDR itself issue, soldering status, measurement positions, skew between scope/measurement channels setup, and phase tuning issue in some DUTs.

Therefore, there is a need for a more robust solution that can accurately separate read and write bursts on all DUTs, especially on problematic DUTs with phase issues.

The object of the present invention is to provide a simple and efficient way to separate read burst signal and write burst signals in DDR automated compliance testing or protocol decoding, especially in a DDR4 signal.

The proposed solution consists mainly of two stages: first, providing the user with the possibility to configure a range of phase difference values for both read and write bursts; second, averaging all phase values in a burst and comparing the averaged result with a pre-configured phase range to identify the burst type.

In particular, in the first stage, the user can roughly and visually check the phases difference value on read and write bursts, and then configure a wide phase range for them as properties. In the second stage, during DDR signal automatic read write processing, in any burst, the phase difference value for each data and its strobe edge is calculated. After the phase for all edges is calculated, the calculated phase values are averaged as an average phase value and compared with a property configured range. If the average value falls in the range of read or write phase, the whole burst will be identified as read or write burst, respectively.

This solution can be implemented in software applications such as RSScopeSuite DDR4 compliance testing option, and can effectively and accurately separate read and write bursts, especially on problematic DUTs.

The present invention offers significant advantages over the conventional solution, as it is more robust and able to handle phase variations on different DUTs, improving the reliability and accuracy of DDR signal processing especially for problematic DUTs.

SUMMARY

The object of the present invention relates to a method, a system, a computer program and a storage medium, for testing a device under test (DUT), in particular for separating a separating read burst signal and write burst signal on problematic DUT (device under test).

A first aspect according to the present invention is a method for testing a device under test, DUT, comprising: generating or receiving, by a component of the DUT, a bus signal, wherein the bus signal comprises a first data signal having a plurality of first phase angles or a second data signal having a plurality of second phase angles; averaging the phase angles for a predetermined bus signal length; comparing the averaged phase angle with a preset phase range; and identifying the first data signal or the second data signal in the bus signal based on the comparison.

In an embodiment of the first aspect, the first data signal is a read data signal, and the second data signal is a write data signal.

In an embodiment of the first aspect, the step of identifying comprises identifying that the signal comprised in the bus signal is a read data signal or a write data signal.

In an embodiment of the first aspect, the method further comprises configuring by a user the preset phase range.

In an embodiment of the first aspect, the configuring by a user the preset phase range is based on a visual inspection of the phase difference values for read and write bursts by the user.

In an embodiment of the first aspect, the configuring by the user the preset phase range comprises defining at least one of an angle range corresponding to a write signal and an angle range corresponding to a read signal.

In an embodiment of the first aspect, the configuring by the user the preset phase range comprises defining an error allowance.

In an embodiment of the first aspect, the comparing step comprises determining whether the averaged phase angle falls within the preset phase range for read or write bursts.

In an embodiment of the first aspect, the bus signal is a Double Data Rate 3, DDR3, or a Double Data Rate 4, DDR4, signal.

A second aspect of the present invention is a system for testing a device under test (DUT), comprising: a receiving module configured for receiving a bus signal from a component of the DUT, wherein the bus signal comprises a first data signal having a plurality of first phase angles or a second data signal having a plurality of second phase angles; an averaging module configured for averaging the phase angles for a predetermined bus signal length; a comparing module configured for comparing the averaged phase angle with a preset phase range; and an identifying module configured for identifying the first data signal or the second data signal in the bus signal based on the comparison.

In an embodiment of the second aspect, the first data signal is a read data signal, and the second data signal is a write data signal and wherein the identifying module is further configured to identify that the signal comprised in the bus signal is a read data signal or a write data signal.

In an embodiment of the second aspect, the system further comprises a user interface module configured for configuring by a user the preset phase range, wherein the configuring by the user the preset phase range is based on a visual inspection of the phase difference values for read and write bursts by the user and comprises defining at least one of an angle range corresponding to a write signal and an angle range corresponding to a read signal and defining an error allowance.

In an embodiment of the second aspect, comparing comprises determining whether the averaged phase angle falls within the preset phase range for read or write bursts.

A third aspect of the present invention is a computer program product comprising instructions which, when the program is executed by a computer, cause the computer to carry out steps of the method according to the first aspect.

A fourth aspect of the present invention is a computer-readable storage medium comprising instructions which, when executed by a computer, cause the computer to carry out the steps of the method according to the first aspect.

Advantageous configurations and developments are apparent from the other dependent claims and from the description with reference to the figures in the drawings.

Where appropriate, the above configurations and developments may be combined in any manner. Other possible configurations, developments and implementations of the disclosure also include combinations, not explicitly mentioned, of features of the disclosure that have been described above or are described hereinafter with reference to the embodiments. In particular, in this case, a person skilled in the art will also add individual aspects as improvements or additions to the basic form of the present disclosure.

BRIEF DESCRIPTION OF THE DRAWINGS

The present disclosure is described in more detail in the following on the basis of the embodiments illustrated in the schematic drawings, in which:

FIG. 4 illustrates an example of default property setting on scope suite in a user interface;

Figure 1:
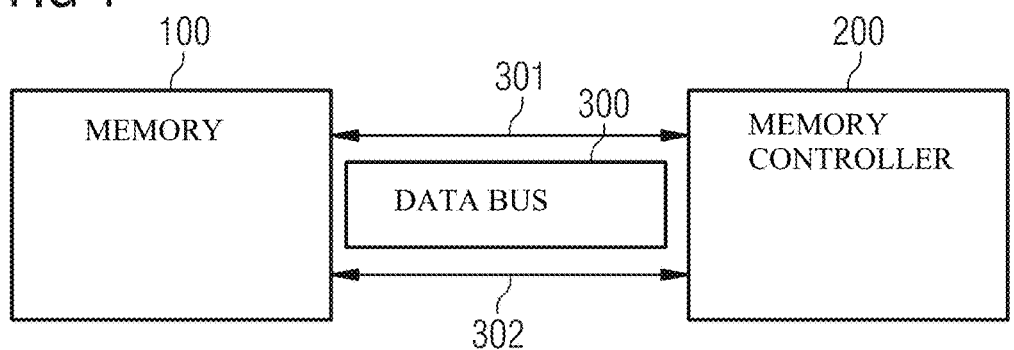
FIG. 1 illustrates the general functioning of DQS triggering for read/write separation according to the present invention.

The attached drawings are intended to provide a better understanding of the embodiments of the disclosure. They illustrate embodiments and, in conjunction with the description, help explain the principles and concepts of the disclosure. Other embodiments and many of the advantages mentioned become apparent from the drawings.

In the drawings, similar, functionally equivalent and identically functioning elements, features and components are provided with similar reference signs in each case, unless otherwise indicated.

DETAILED DESCRIPTION

Hereinafter, the embodiments will now be described in detail with reference to the attached drawings. However, the disclosure may not be limited to the implementation in which the idea of the disclosure is presented, and another implementation included within the range of the idea of another prior disclosure, or the prior disclosure may be readily proposed by adding, changing, deleting and the like of another element.

The terms used in this specification have been chosen to include common and widely used general terms. In some cases, a term may be one that has been arbitrarily established by the applicant. In such cases, the meaning of the term will be defined in the relevant part of the detailed description. Thus, the terms used in the specification should not be defined simply by the names of the terms, but should be defined on the basis of the meaning of the terms as well as the general description of the present disclosure.

Hereinafter, embodiments of the present disclosure will be described in detail with reference to the accompanying drawings. It should be noted that the same reference numerals are used to designate identical or similar elements in the drawings.

FIG. 1 illustrates the general functioning of DQS triggering for read/write separation according to the present invention.

DQS triggering is a technique used for read and write burst separation in DDR memory systems. In DDR systems, data is transferred on both the rising and falling edges of the clock, allowing for faster data transfers. However, this also means that read 301 and write 302 operations share the same data bus 300, which complicates the process of separating read and write bursts during testing or signal analysis.

The DQS (Data Strobe) signal is a bi-directional signal used for synchronization and to indicate the valid data window during read and write operations. The DQS signal's behavior and relationship with the data signals are different during read 301 and write 302 bursts, which can be exploited to separate read and write operations.

For example, for read bursts, the DQS signal is generated by the DDR memory 100 and is in-phase with the data signals. The memory controller 200 receives and samples the data signals when the DQS signal is active, ensuring accurate data capture.

On the other hand, for write bursts, the DQS signal is generated by the memory controller 200 and is typically 90 degrees (a quarter clock cycle) out-of-phase with the data signals. This phase difference ensures that the memory (DRAM) can latch the data signals accurately during the write operation.

To separate read and write bursts using DQS triggering, the phase difference between the DQS signal and the data signals is analyzed. If the DQS signal is in-phase with the data signals (i.e., 0 degree phase shift), it is considered a read burst. If the DQS signal is 90 degrees out-of-phase (90 degrees phase shift) with the data signals, it is considered a write burst.

However, in real-world scenarios, the phase difference may not always be exactly 0 or 90 degrees due to factors such as manufacturing tolerances, signal integrity issues, and measurement inaccuracies. To account for these factors, a more robust method may involve setting a range of acceptable phase differences for read and write bursts (for instance +/−20 degrees), and then averaging the phase angles over a predetermined length of the bus signal. By comparing the averaged phase angles with the preset phase range, read and write bursts can be identified and separated more accurately, especially for problematic devices under test (DUTs).

Figure 2:
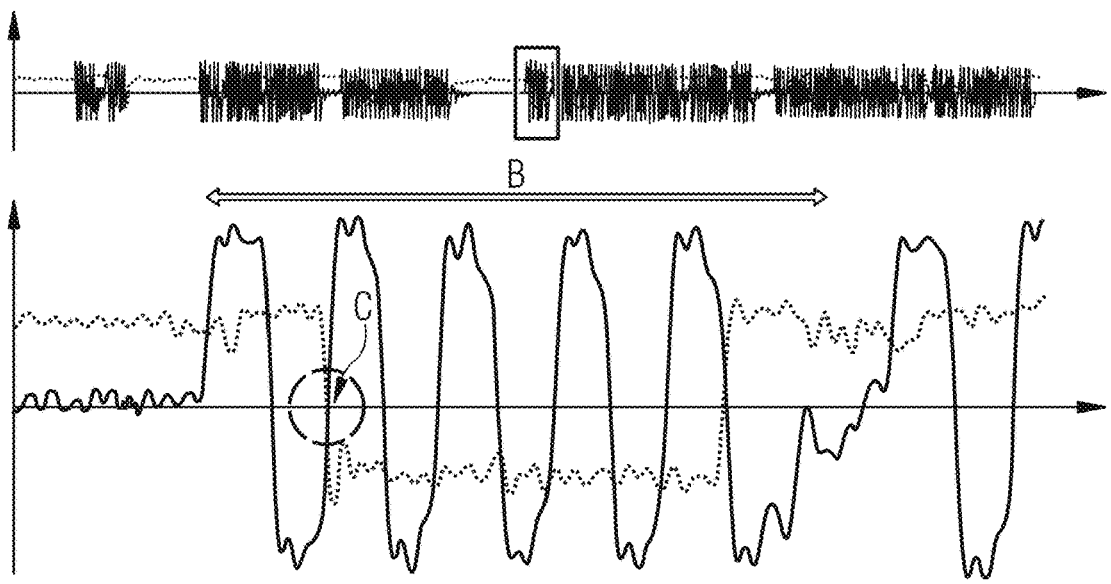
FIG. 2 illustrates the case of a DDR 4 phase based triggering for read burst.

FIG. 2 illustrates the case of a DDR 4 phase based triggering for read burst.

In the example of FIG. 2, one burst B consists in five periods of DQS signal. The full line is for the DQS and the dotted line is for the DQ. In FIG. 2, the DQ and the DQS have crossing points at equilibrium voltage level of 0V. This corresponds to 0-degree phase difference. In other words, this is a read burst.

Figure 3:
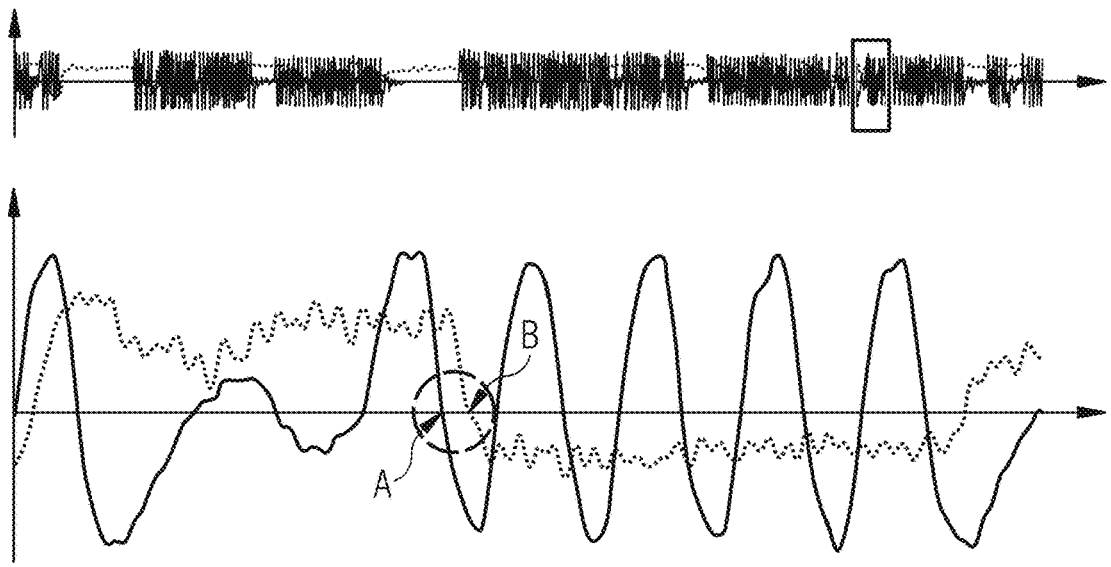
FIG. 3 illustrates the case of a DDR 4 phase based triggering for write burst.

FIG. 3 illustrates the case of a DDR 4 phase-based triggering for write burst.

In the example of FIG. 3, one period of DQS is taken as 360 degrees. The position A (crossing point for the DQS) is taken as 0 degree and position B is taken as 90 degrees. The phase difference between positions A and B is 90 degrees. In other words, this is a write burst.

FIG. 4 illustrates an example of default property setting on scope suite.

The phased based triggering is illustrated with a Read at 0 degree phase shift, a write at 90 degrees phase difference and an error allowance is defined for +/−20 degrees.

Figure 5:
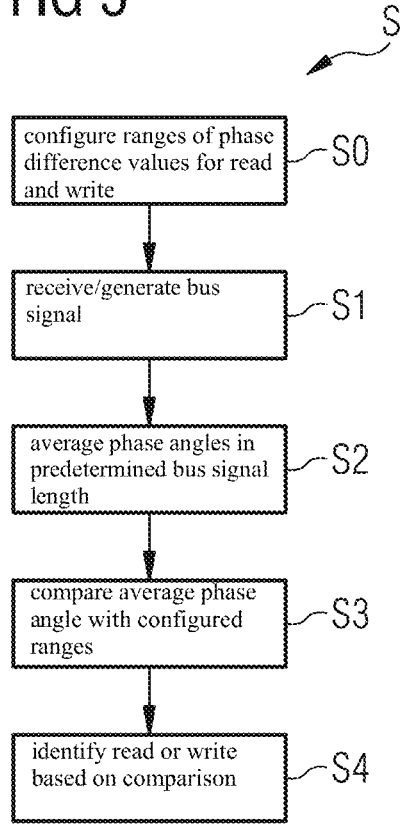
FIG. 5 illustrates the steps of a method for testing a device according to the present invention.

FIG. 5 illustrates the steps of a method for testing a device according to the present invention.

The method S can be used for performing test on a device under test or during the operation. When being performed, the method S allows to perform an automated read and write burst separation on problematic DUT.

As a preliminary and optional step S0, a user can configure a range of phase difference values for both read and write bursts (as illustrated in FIG. 4). This can be done by the user after he roughly and visually check the phase difference value and read and write bursts for instance on the display of an oscilloscope. The user can subsequently configure a wide phase range for the phase difference value on read and write as properties.

At step S1, a component of the DUT 1 can receive (or alternatively generate) a bus signal, wherein the bus signal comprises a first data signal having a first phase angle or a second data signal having a second phase angle. The first signal can be a DQS signal and the second signal can be a DQ signal. And the bus signal can be a DDR 3 or a DDR 4 signal.

At step S2, the phase angles in a predetermined bus signal length are averaged. The predetermined bus signal length can correspond to a burst length. In particular, in any burst, the phase difference value for each data and its strobe edge (for each DQ and DQS) can be calculated. The averaging is performed after the calculation of all edges. The averaging comprises calculating an average phase angle value.

At step S3, the averaged phase angles are compared with a preset phase range. The preset phase range can correspond to the range of phase difference values for both read and write bursts as configured by the user at the step S0 above.

At step S4, the first data signal or the second data signal in the bus signal is identified based on the comparison. For example, the range of phase difference values of the preset phase range corresponding to a write burst or a read bust is compared to the averaged phase angles taking into account an error allowance which can be preset, for instance at the optional step S0 by the user. This error allowance can be a range of +/−40 degrees, more particularly +/−30 degrees, even more particularly +/−20 degrees or +/−10 degrees. That is to say that if the average value falls withing the range of read and write phase range, the entire burst will be identified as a read or write burst accordingly.

Figure 6:
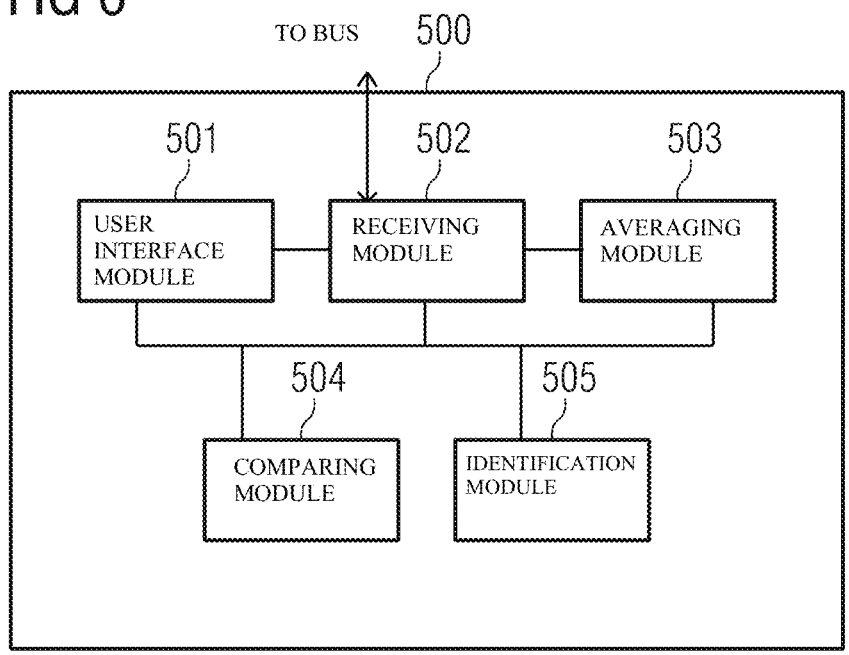
FIG. 6 illustrates system (500) for testing a device according to the present invention.

FIG. 6 illustrates a system for testing a device according to the present invention.

The system 500 can be used for performing test on a device under test (DUT) and it is capable of performing an automated read and write burst separation on problematic DUT.

The system 500 can comprise a user interface module 501 which is configured such that a user can configure a range of phase difference values for both read and write bursts. This can be done by the user after he roughly and visually checks the phase difference value and read and write bursts for instance on a display of the system which can be or comprises an oscilloscope.

The user can subsequently configure a wide phase range for the phase difference value on read and write as properties.

A receiving module 502 of the system 500 is configured to receive a bus signal from a component of the DUT 1, wherein the bus signal comprises a first data signal having a first phase angle or a second data signal having a second phase angle. The first signal can be a DQS signal and the second signal can be a DQ signal. And the bus signal can be a DDR 3 or a DDR 4 signal.

An averaging module 503 of the system 500 is configured to average the phase angles in a predetermined bus signal length. The predetermined bus signal length can correspond to a burst length. In particular, in any burst, the phase difference value for each data and its strobe edge (for each DQ and DQS) can be calculated. The averaging module 503 performs the averaging after the calculation of all edges. This averaging can comprises calculating an average phase angle value.

A comparing module 504 of the system 500 is configured to compare the averaged phase angles with a preset phase range. The preset phase range can correspond to the range of phase difference values for both read and write bursts as configured by the user in the use interface module 501.

An identification module 505 of the system 505 is configured to identify the first data signal or the second data signal in the bus signal based on the comparison of the comparison module. For example, the range of phase difference values of the preset phase range corresponding to a write burst or a read bust is compared to the averaged phase angles taking into account an error allowance which can be preset, for instance at the optional step S0 by the user. This error allowance can be a range of +/−40 degrees, more particularly +/−30 degrees, even more particularly +/−20 degrees or +/−10 degrees. That is to say that if the average value falls withing the range of read and write phase range, the entire burst will be identified as a read or write burst accordingly.

An embodiment of the present application can be a software program comprising instructions or a storage medium for storing instructions, which when read by a processor enable the processor to perform the method S.

The solution disclosed in the present specification is a simple and efficient approach for easily separating the read burst signal and the write burst signal in DDR automated compliance testing or protocol decoding, especially in DDR4 signal.

LIST OF REFERENCES SIGNS

1: Device under Test—DUT
100: DDR Memory
200: Memory controller
300: Data BUS
301: Read transfer
302: Write transfer
B: Burst
C: Crossing
A: Point A
B: Point B
500: System for testing a DUT
501: User interface module
502: Receiving module
503: Averaging module
504: Comparing module
505: Identification module
S: Method for testing the device
S0: configuring the range of phase difference values
S1: Generating or receiving a bus signal
S2: Generating or receiving a bus signal
S3: Generating or receiving a bus signal
S4: Generating or receiving a bus signal
S5: Generating or receiving a bus signal

The invention claimed is:

1. A method for testing a device under test, DUT, comprising:
   transmitting a bus signal between a DDR memory and a memory controller in the DUT, wherein the bus signal comprises a first data signal having a plurality of first phase angles or a second data signal having a plurality of second phase angles;
   receiving the bus signal with a receiving module;
   configuring a range of phase difference values through a user interface;
   averaging the phase angles of the bus signal for a predetermined bus signal length using an average module, wherein the averaging comprises determining an average phase angle value;
   comparing the averaged phase angle value with a preset phase range using a comparing module; and
   identifying a type of the first data signal or the second data signal in the bus signal based on the comparison using an identifying module;
   further comprising configuring by a user the preset phase range,
   wherein the configuring by the user the preset phase range is based on a visual inspection of the phase difference values for read and write bursts by the user,
   wherein the configuring by the user the preset phase range comprises defining at least one of an angle range corresponding to a write signal and an angle range corresponding to a read signal,
   wherein the comparing step comprises determining whether the averaged phase angle falls within the preset phase range for read or write bursts.

2. The method of claim 1, wherein the first data signal is a read data signal and the second data signal is a write data signal.

3. The method of claim 2, wherein the step of identifying comprises identifying that the signal comprised in the bus signal is a read data signal or a write data signal.

4. The method of claim 1, wherein the configuring by the user the preset phase range comprises defining an error allowance.

5. The method of claim 1, wherein the bus signal is a Double Data Rate 3, DDR3, or a Double Data Rate 4, DDR4, signal.

6. The system of claim 1, wherein comparing comprises determining whether the averaged phase angle falls within the preset phase range for read or write bursts.

7. A computer implemented method comprising instructions which, when executed by a computer, cause the computer to carry out steps of the method of claim 1.

8. A non-transitory computer-readable recording medium storing instructions which, when executed by a computer, cause the computer to carry out the steps of the method of claim 1.

9. A system for testing a device under test, comprising:
- a bus extending between a DDR memory and a memory controller which carries a bus signal therebetween;
- a receiving module coupled to the bus configured for receiving the bus signal from a component of the DUT, wherein the bus signal comprises a first data signal having a plurality of first phase angles or a second data signal having a plurality of second phase angles;
- an averaging module configured for averaging the phase angles for a predetermined bus signal length, wherein the averaging comprises determining an average phase angle value;
- a comparing module configured for comparing the averaged phase angle value with a preset phase range; and
- an identifying module configured for identifying the first data signal or the second data signal in the bus signal based on the comparison;
- further comprising a user interface module configured for configuring by a user the preset phase range, wherein the configuring by the user the preset phase range is based on a visual inspection of the phase difference values for read and write bursts by the user and comprises defining at least one of an angle range corresponding to a write signal and an angle range corresponding to a read signal and defining an error allowance.

10. The system of claim 9, wherein the first data signal is a read data signal and the second data signal is a write data signal and wherein the identifying module is further configured to identify that the signal comprised in the bus signal is a read data signal or a write data signal.

* * * * *